(12) United States Patent
Ren

(10) Patent No.: US 8,324,945 B2
(45) Date of Patent: Dec. 4, 2012

(54) ELECTRONIC DEVICE WITH RESET CIRCUIT

(75) Inventor: Dong-Liang Ren, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 5 days.

(21) Appl. No.: 13/086,206

(22) Filed: Apr. 13, 2011

(65) Prior Publication Data

US 2012/0169385 A1 Jul. 5, 2012

(30) Foreign Application Priority Data

Dec. 31, 2010 (CN) .......................... 2010 1 0616835

(51) Int. Cl.
 *H03L 7/00* (2006.01)
(52) U.S. Cl. ....................................................... 327/143
(58) Field of Classification Search ........................ None
 See application file for complete search history.

(56) References Cited

U.S. PATENT DOCUMENTS

| 4,808,853 A | * | 2/1989 | Taylor | 326/57 |
| 5,640,111 A | * | 6/1997 | Hasegawa | 327/122 |
| 5,696,979 A | * | 12/1997 | Saitou | 713/323 |

* cited by examiner

*Primary Examiner* — Lincoln Donovan
*Assistant Examiner* — Sibin Chen
(74) *Attorney, Agent, or Firm* — Altis Law Group, Inc.

(57) ABSTRACT

A reset circuit used for resetting a processing unit of an electronic device includes a switch control unit, a first switch unit, and a reset signal generation unit. The switch control unit controls the on and off state of the first switch unit according to users' operation. The reset signal generation unit outputs a reset signal after the first switch unit has been off for a predetermined time period. The reset signal generation unit stops outputting the reset signal as the first switch unit turns on. The processing unit is reset when receiving the reset signal.

17 Claims, 3 Drawing Sheets

ELECTRONIC DEVICE WITH RESET CIRCUIT

BACKGROUND

1. Technical Field

The present disclosure relates to electronic devices, particularly to an electronic device having a reset circuit.

2. Description of Related Art

Sometimes, when an electronic device freezes-up a reset button is pressed to reboot the electronic device. However, the reset button may be accidentally pressed even when the electronic device is operating normally.

Therefore, there is room for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
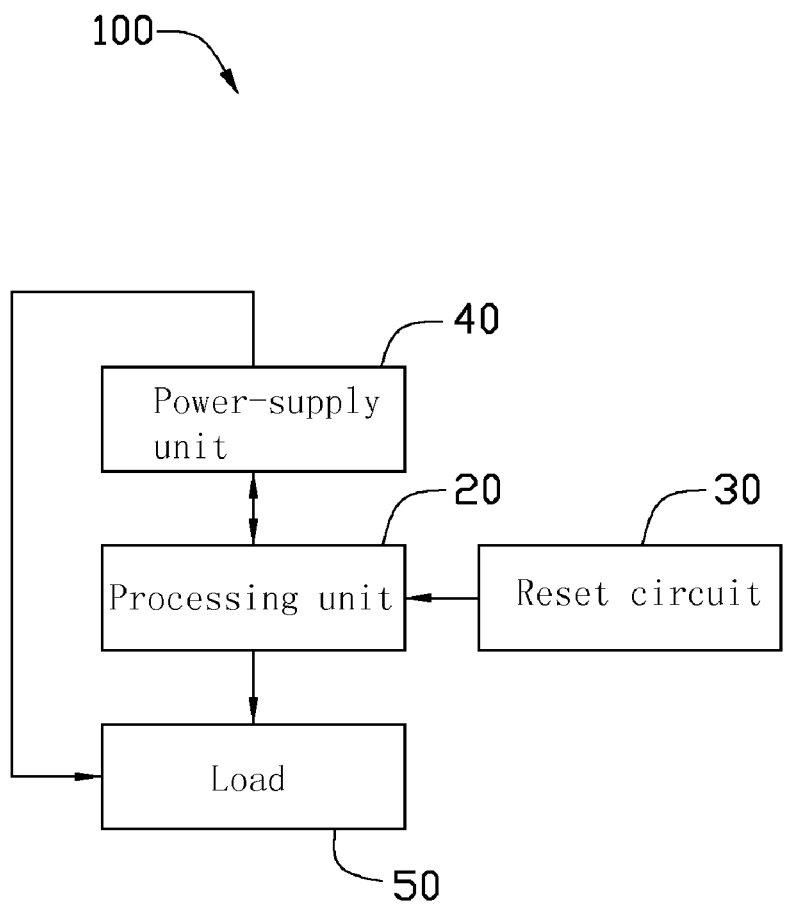
FIG. 1 is a schematic view of an electronic device according to an embodiment of the present disclosure, and the electronic device includes a reset circuit.
Figure 2:
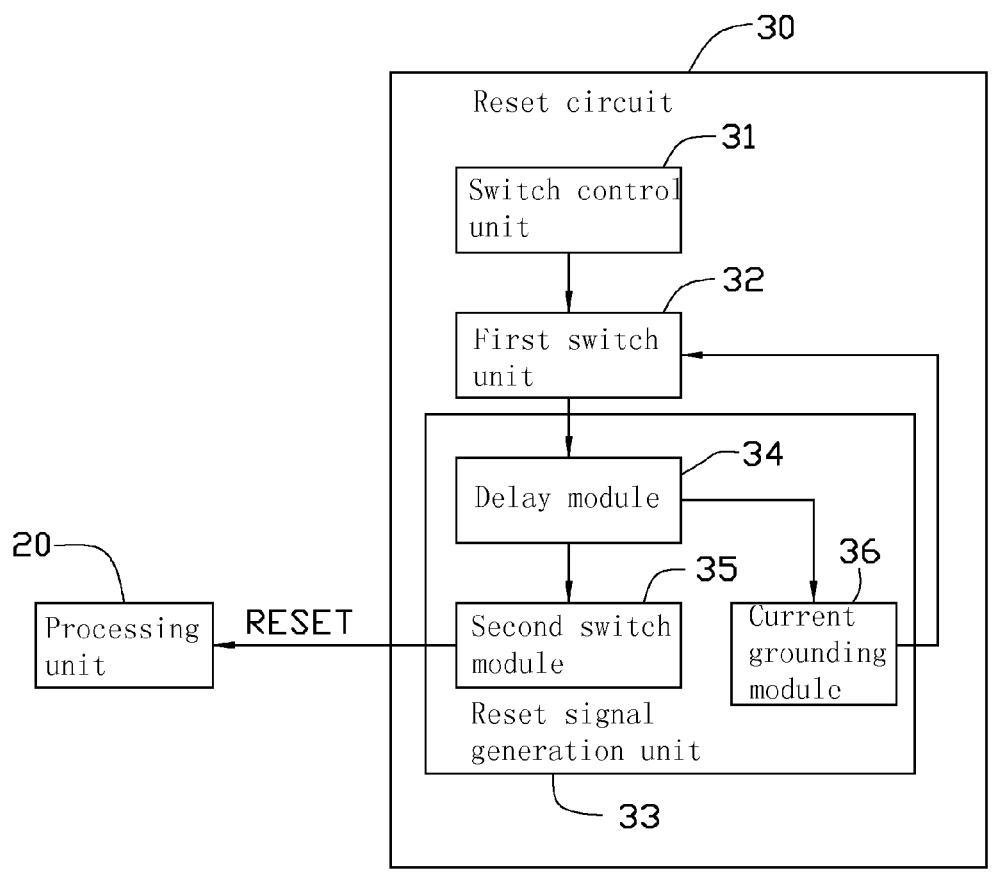
FIG. 2 is a functional block diagram of the reset circuit of FIG. 1.

Referring to FIGS. 1 and 2, an electronic device 100 according to an embodiment of the present disclosure may include a processing unit 20, a reset circuit 30, a power-supply unit 40, and a load 50. The processing unit 20 includes a reset pin RESET. The reset circuit 30 is used to reset the processing unit 20. The power-supply unit 40 is used for supplying power to components of the electronic device 100. The load 50 connects the processing unit 20 to the power-supply unit 40, and corresponds to a total resistance of lumped components of the electronic device 100. In an embodiment, the processing unit 20 is a power-control integrated circuit chip, the load 50 is a music player of the electronic device 100, and the RESET pin is activated when a low-level signal is received. In other embodiments, the load 50 may correspond to the resistance of other lumped components of the electronic device 100, such as a video player or a Bluetooth module. In other embodiments the RESET pin may be activated when a high-level signal is received.

The circuit 30 includes a switch control unit 31, a first switch unit 32, and a reset signal generation unit 33.

During operation, the switch control unit 31 outputs a first control signal or a second control signal. In the embodiment, the first control signal and the second judging signal may be respectively a high-level signal recognized to be a logical "1" and a low-level signal recognized as logical "0". In other alternative embodiments, the first control signal may be a low-level signal as logical "0" and the second control signal may be a high-level signal as logical "1".

The first switch unit 32 can change states between on and off according to the first control signal and the second control signal.

The reset signal generation unit 33 includes a delay module 34, a second switch module 35, and a current grounding module 36. The delay module 34 is connected to the first switch unit 32 for outputting a transistor threshold voltage after the first switch unit 32 remains off for a predetermined time period. The second switch module 35 is used for receiving the threshold voltage and then outputting a reset signal to the RESET pin. The delay module 34 includes a capacitor (see FIG. 3) for storing electrical energy when the first switch unit 32 turns off and further generating the threshold voltage. The current grounding module 36 is used for sending current from the capacitor to ground as the first switch unit 32 turns on.

Figure 3:
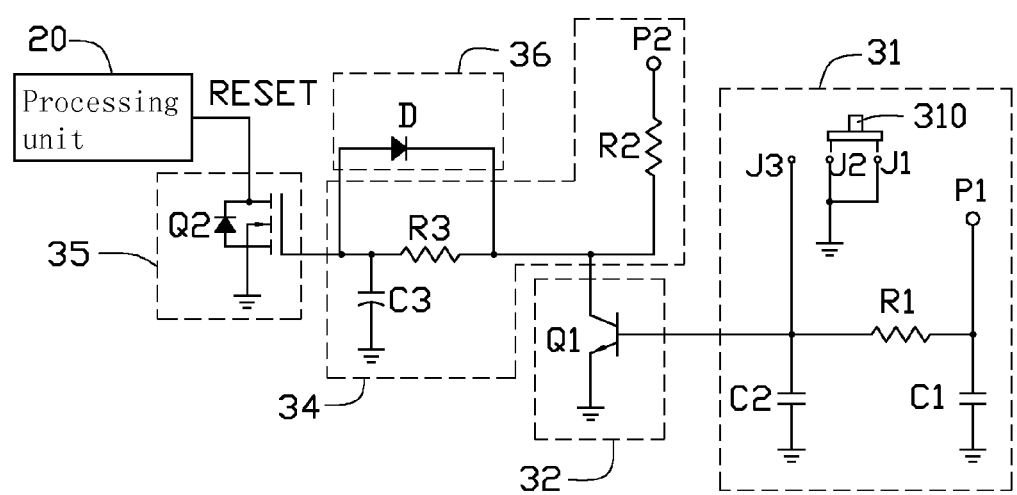
FIG. 3 is a circuit diagram of the reset circuit of FIG. 2.

Referring to FIG. 3, the switch control unit 31 includes a switch 310, a first power port P1, a resistor R1, and capacitors C1 and C2. The switch 310 includes a common contact port J1, a first contact port J2, and a second contact port J3. The port J1 and the port J2 are connected to ground, while the port J3 is connected to the port P1 via the resistor R1. The port P1 is used for supplying a first working power. The capacitor C1 is connected between the port P1 and ground. The capacitor C2 is connected between the port J3 and ground. In certain applications where noise does not need to be filtered through the control module 31 the capacitors C1 and C2 may be omitted.

The first switch unit 32 includes a transistor Q1. The base of the transistor Q1 is connected to the port J3, the emitter thereof is connected to ground and the collector thereof is connected to the delay module 34. In the embodiment, the transistor Q1 is an npn type bipolar junction transistor (BJT).

The delay module 34 includes a second power port P2, resistors R2, R3, and a capacitor C3. The port P2 is used for supplying a second working power. The resistors R2 and R3 are connected in series between the capacitor C3 and the port P2. The capacitor C3 is also connected to ground. The collector of the transistor Q1 is connected between the resistors R2 and R3.

The second switch module 35 includes a transistor Q2. The gate of the transistor Q2 is connected to the resistor R3 and the capacitor C3, the source thereof is connected to ground, and the drain thereof is connected to the RESET pin. In the embodiment, the transistor Q2 is an n-type enhanced mode metal oxide semiconductor field effect transistor (MOSFET).

The current grounding module 36 includes a diode D with the anode thereof connected to the gate of the transistor Q2 and the cathode thereof connected to the collector of the transistor Q1.

In the embodiment, the port P1 and the port P2 are both used for supplying 3 volts direct current (DC). The threshold voltages of the transistors Q1 and Q2 are about 0.7 volts and 1.8 volts. However, the threshold voltages can be varied in other embodiments as other types of transistors are applied.

Following is a detailed description of the working process of the electronic device 100.

In use, the ports J1 and J2 are grounded and connected to each other via switch 310, power is supplied to port P1, therefore, the switch control unit 31 outputs a high-level signal as logical "1", that is, the first control signal to the first switch unit 32. The transistor Q1 turns on by receiving the first control signal, thereby connecting the collector to the emitter and to ground. In this state, the resistor R2 is connected between the port P2 and ground. The transistor Q2 is off, the RESET pin thus is not activated. Therefore, the processing unit 20 is not reset.

If the processing unit 20 cannot work properly and the electronic device 10 becomes frozen, users can slide the switch 310 to reset the electronic device 100. As the switch 310 is kept on a switched-on state, the port J2 contacts the port J3, thereby connecting the port J3 to ground. In this state, the second control signal from the switch control unit 31 is at logical low state as "0". The transistor Q1 then is turned off when receiving the second control signal. Capacitor C3 charges up due to the voltage supplied by the second power port P2.

According to the formula for calculating the voltage across the capacitor C3, u=U [1−e^−t/(RC)] (u is the voltage across the capacitor C3, U is the power supplied from the second power port P2, and t is a predetermined time period), the voltage across the capacitor C3 reaches the threshold voltage of the transistor Q2, that is, 1.8 volts, to turn on the transistor Q2, thereby connecting the drain to the source and to ground. The transistor Q2 thus pulls the RESET pin to ground and outputs the reset signal to the RESET pin. The processing unit 20 is then reset.

As the switch 310 is switched off, the transistor Q1 consequently turns on. The capacitor C3 is connected to ground and discharges via the diode D and the collector and emitter of the transistor Q1. As the capacitor C3 discharges, the voltage across the capacitor C3 becomes less than the threshold voltage of the transistor Q2. To quickly reduce the voltage across the capacitor C3 to less than the threshold voltage of the transistor Q2 as soon as the transistor Q1 turns on, the current from the capacitor C3 is sent to ground via the diode D, which makes the transistor Q2 turn off immediately after the transistor Q1 turns on. Therefore, the processing unit 20 is not continuing trying to reset.

In the embodiment, the resistance value of the resistors R2 and R3 are each 51 thousand ohms, and the capacitance of the capacitor C3 is 47 microfarads. According to the formula u=U [1−e^−t/(RC)], the voltage across the capacitor C3 reaches the threshold voltage of the transistor Q2 after the predetermined time period of about 4 seconds. However, in some embodiments, the resistance value of the resistor R2 and R3 or the capacitance of the capacitor C3 can be different in order to change the predetermined time period t. Also, the predetermined time period t can be adjusted by applying transistors of different threshold voltages. In some applications the resistor R3 may be omitted from the delay module 34.

Users can switch on the switch 310 to reset the processing unit 20 by the reset circuit 30 in the electronic device 100. Moreover, in order to reset the processing unit 20, the switch 310 should remain in a switched-on state for a predetermined time period t, which can prevent accidental reset of the electronic device 100. Additionally, with the current grounding module 36, the current from the capacitor C3 can be sent to ground as soon as the processing unit 20 is reset. Therefore, damage to the processing unit 20 from continuous activation of the RESET pin can be avoided.

It is to be understood, however, that even though Information and advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. A reset circuit used for generating a reset signal to reset a processing unit, comprising:
   a first switch unit;
   a switch control unit controlling on and off state of the first switch unit according to users' operation; and
   a reset signal generation unit, the reset signal generation unit comprising:
      a delay module for outputting a high level threshold voltage after the first switch unit has been turned off for the predetermined time period; and
      a second switch module for outputting the reset signal according to the high level threshold voltage;
      wherein the delay module outputs a low level threshold voltage when the first switch unit is turned on; the second switch module stops outputting the reset signal according to the low level threshold voltage.

2. The reset circuit as claimed in claim 1, wherein the switch control unit comprises a first power port, a switch, and a first resistor, the first power port is used for supplying a first working power, the switch controls the first working power to the first switch unit via the first resistor according to users' operation.

3. The reset circuit as claimed in claim 1, wherein the first switch unit comprises a first transistor, the base of the first transistor is connected to the switch control unit, the emitter thereof is connected to ground, and the collector thereof is connected to the delay module.

4. The reset circuit as claimed in claim 3, wherein the processing unit comprises a reset pin for receiving the reset signal, the second switch module comprises a second transistor with the gate thereof for receiving the threshold voltage, the drain thereof connected to the reset pin, and the source thereof connected to ground.

5. The reset circuit as claimed in claim 3, wherein the delay module comprises a second power port, a capacitor, and a second resistor, the second power port is used for supplying a second working power, the second resistor is connected between the second power port and the second switch module, one end of the capacitor is connected to the second resistor, the other end thereof is connected to ground.

6. The reset circuit as claimed in claim 5, wherein the delay module further comprises a third resistor connected between the second resistor and the capacitor.

7. The reset circuit as claimed in claim 6, wherein the reset signal generation unit comprises a current grounding module used for sending current from the capacitor to ground as the first transistor turns on.

8. The reset circuit as claimed in claim 7, wherein the current grounding module comprises a diode, the anode of the diode is connected to the capacitor, and the cathode thereof is connected to the collector of the first transistor.

9. The reset circuit as claimed in claim 6, wherein the capacitance of the capacitor, the resistance value of the second resistor and the third resistor are adjustable.

10. An electronic device, comprising:
   a processing unit;
   a reset circuit for resetting the processing unit, the reset circuit comprising:
   a first switch unit;
   a switch control unit for controlling on and off state of the first switch unit according to users' operation; and
   a reset signal generation unit the reset signal generation unit comprising:
      a delay module for outputting a high level threshold voltage after the first switch unit has been turned off for the predetermined time period; and
      a second switch module for outputting the reset signal after receiving according to the high level threshold voltage;
   the processing unit being reset in response to the reset signal;
   wherein the delay module outputs a low level threshold voltage when the first switch unit is turned on; the second switch module stops outputting the rest signal according to the low level threshold voltage.

11. The electronic device as claimed in claimed 10, wherein the electronic device further comprises a power-supply unit and a load, the processing unit is a power-control integrated circuit chip, the power-supply unit supplies power to the load under the control of the processing unit.

12. The electronic device as claimed in claim 10, wherein the switch control unit comprises a first power port, a switch, and a first resistor, the first power port is used for supplying a first working power, the switch controls the supply of the first working power to the first switch unit via the first resistor according to users' operation.

13. The electronic device as claimed in claim 10, wherein the first switch unit comprises a first transistor, the base of the first transistor is connected to the switch control unit, the emitter thereof to ground, and the collector thereof to the delay module.

14. The electronic device as claimed in claim 13, wherein the processing unit comprises a reset pin for receiving the reset signal, the second switch module comprises a second transistor with the gate thereof used for receiving the threshold voltage, the drain thereof connected to the reset pin, and the source thereof connected to ground.

15. The electronic device as claimed in claim 13, wherein the delay module comprises a second power port, a capacitor, a second resistor, and a third resistor, the second power port is used for supplying a second working voltage, the second resistor and the third resistor are connected between the second power port and the second switch module, one end of the capacitor is connected to the third resistor, the other end thereof is connected to ground.

16. The electronic device as claimed in claim 15, wherein the reset signal generation unit comprises a current grounding module for sending current from the capacitor to ground as the first transistor turns on.

17. The electronic device as claimed in claimed 16, wherein the electronic device further comprises a power-supply unit and a load, the processing unit is a power-control integrated circuit chip, the power-supply unit supply power to the load under the control of the processing unit.

* * * * *